US009153433B2

(12) United States Patent
Kato et al.

(10) Patent No.: US 9,153,433 B2
(45) Date of Patent: Oct. 6, 2015

(54) METHOD OF DEPOSITING A FILM AND FILM DEPOSITION APPARATUS

(71) Applicant: Tokyo Electron Limited, Tokyo (JP)

(72) Inventors: Hitoshi Kato, Iwate (JP); Keiichi Tanaka, Iwate (JP); Hiroyuki Kikuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 14/054,932

(22) Filed: Oct. 16, 2013

(65) Prior Publication Data

US 2014/0113436 A1 Apr. 24, 2014

(30) Foreign Application Priority Data

Oct. 18, 2012 (JP) .................. 2012-230897

(51) Int. Cl.
| | |
|---|---|
| *H01L 21/20* | (2006.01) |
| *H01L 21/36* | (2006.01) |
| *H01L 21/02* | (2006.01) |
| *C23C 16/24* | (2006.01) |
| *C23C 16/455* | (2006.01) |

(52) U.S. Cl.
CPC .......... *H01L 21/02532* (2013.01); *C23C 16/24* (2013.01); *C23C 16/45527* (2013.01); *C23C 16/45551* (2013.01); *H01L 21/0262* (2013.01); *H01L 21/02381* (2013.01)

(58) Field of Classification Search
None
See application file for complete search history.

(56) References Cited

U.S. PATENT DOCUMENTS

| | | | |
|---|---|---|---|
| 2004/0140510 A1* | 7/2004 | Hazama ................. | 257/390 |
| 2007/0087581 A1* | 4/2007 | Singh et al. .......... | 438/780 |
| 2010/0055319 A1* | 3/2010 | Kato et al. ............ | 427/255.28 |

OTHER PUBLICATIONS

"Research-Atomic Layer Deposition", [online], Tufts Plasma Engineering Laboratory, Internet URL : www.ece.tufts.edu/~hopwood/lab/PEALD.htm, Search date: Jul. 27, 2012.
Jun-ichi Nishizawa, et. al, "Journal of the Electrochemical Society", 149 (7), G399-G402, 2002, "Doping Technology for Silicon Thin Films Grown by Temperature-Modulation Molecular Layer Epitaxy".

* cited by examiner

*Primary Examiner* — Evan Pert
*Assistant Examiner* — Shaka White
(74) *Attorney, Agent, or Firm* — IPUSA, PLLC

(57) ABSTRACT

A disclosed method of depositing a silicon film on a substrate mounted on a turntable and can pass by rotation through a first process area and a second process area, which are separately arranged along a peripheral direction in a cylindrical chamber set to have a first temperature capable of cutting a Si—H bond includes a molecular layer deposition step of supplying a $Si_2H_6$ gas set to have a second temperature less than the first temperature when the substrate passes through the first process area thereby forming a $SiH_3$ molecular layer on a surface of the substrate, and a hydrogen desorption step of causing the substrate, on a surface of which the $SiH_3$ molecular layer is formed, to pass through the second process area maintained to have the first temperature thereby cutting the Si—H bond and leaving only a silicon atomic layer on the surface of the substrate.

20 Claims, 12 Drawing Sheets

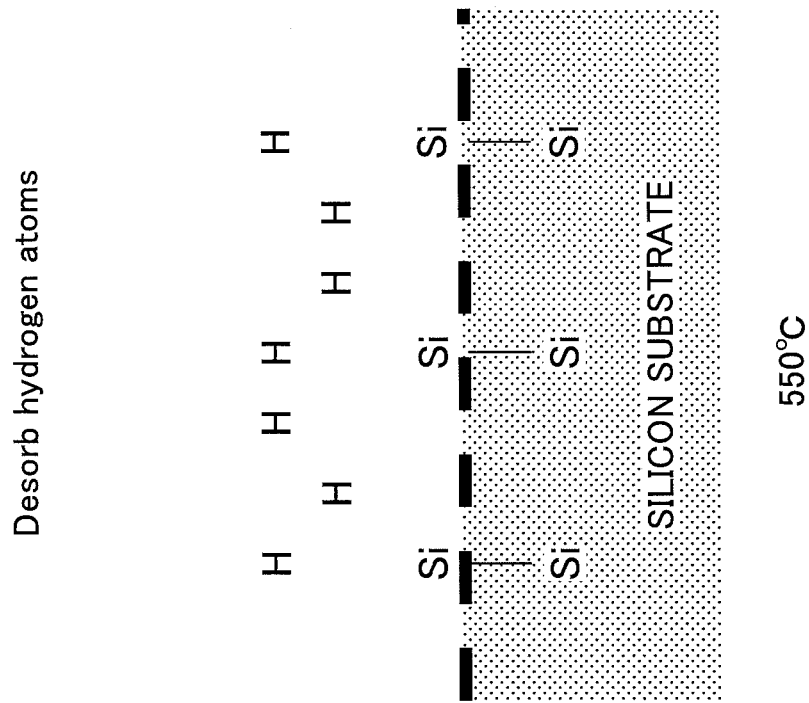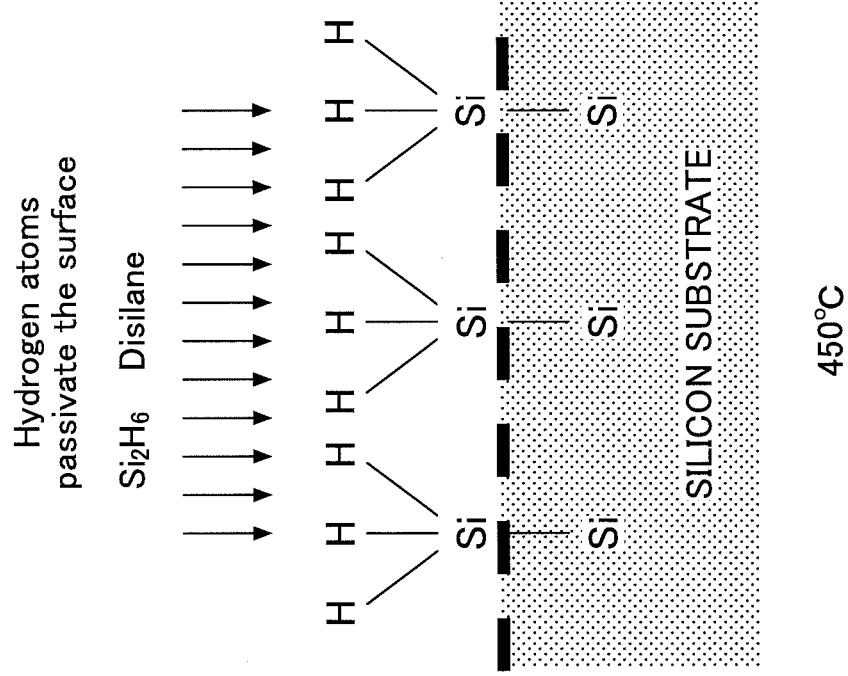

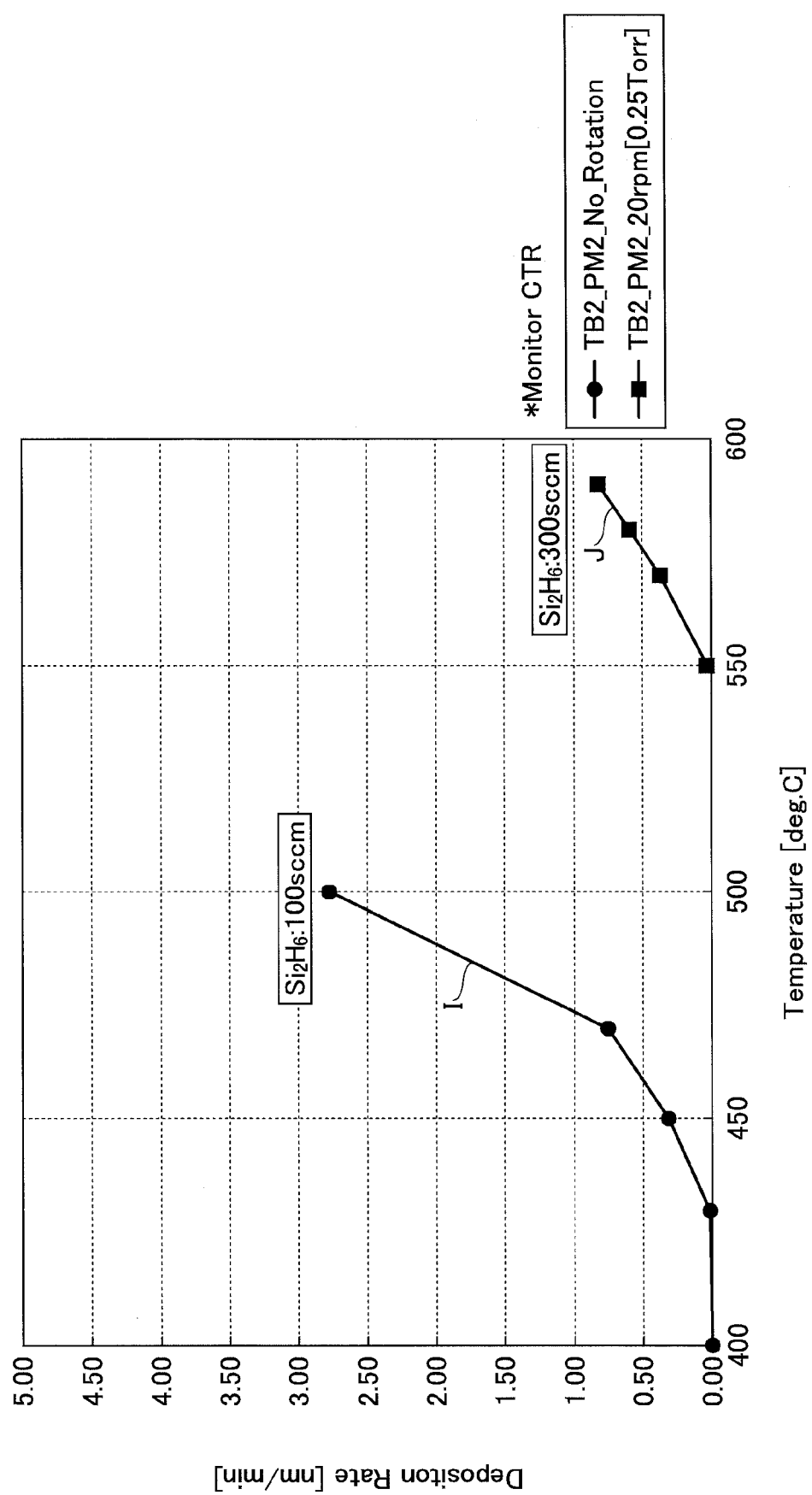

FIG.11

| | | | | | |
|---|---|---|---|---|---|
| | Si$_2$H$_6$ / N$_2$[sccm] | 0 | 300 / 600 | 100 / 800 | 50 / 850 | 25 / 875 |
| | Depo time[min] | 0 | 23 | 58 | 67 | 90 |
| | Depo Rate[nm/min] | 0 | 0.69 | 0.42 | 0.32 | 0.25 |
| | Cycle Rate[nm/cycle] | 0 | 0.035 | 0.021 | 0.016 | 0.012 |
| Aspect ratio [24-28]<br>・Opening: 65-70nm<br>・Depth: 1600-1800nm | TOP | | | | | |
| | MID | | | | | |
| | BTM | | | | | |
| Thickness [nm] | Thickness [nm] @SFX200 | | 16 | 24 | 21 | 22 |
| | TOP | 0 | 17 | 27 | 25 | 24 |
| | TOP side1_Depth50nm | 0 | 13 | 23 | 23 | 22 |
| | TOP side2_Depth150nm | 0 | 12 | 23 | 23 | 22 |
| | TOP side3_Depth250nm | 0 | 12 | 23 | 22 | 22 |
| | MID side_Depth800nm | 0 | 11 | 23 | 22 | 22 |
| | BTM side_Depth1600-1800nm | 0 | 11 | 22 | 22 | 22 |
| step coverage [TOP=1] | TOP | 0 | 100 | 100 | 100 | 100 |
| | TOP side1_Depth50nm | 0 | 76 | 85 | 92 | 92 |
| | TOP side2_Depth150nm | 0 | 71 | 85 | 92 | 92 |
| | TOP side3_Depth250nm | 0 | 71 | 85 | 88 | 92 |
| | MID side_Depth800nm | 0 | 65 | 85 | 88 | 92 |
| | BTM side_Depth1600-1800nm | 0 | 65 | 81 | 88 | 92 |

METHOD OF DEPOSITING A FILM AND FILM DEPOSITION APPARATUS

CROSS-REFERENCE TO RELATED APPLICATIONS

This patent application is based upon and claims the benefit of priority of Japanese Patent Application No. 2012-230897 filed on Oct. 18, 2012, the entire contents of which are incorporated herein by reference.

BACKGROUND OF THE INVENTION

1. Field of the Invention

The present invention generally relates to a method of depositing a film and a film deposition apparatus, specifically to a method of depositing a film and a film deposition apparatus, with which a silicon film is formed on a substrate.

2. Description of the Related Art

An Atomic Layer Deposition (ALD) method of forming a film in a level of atomic layers and a Molecular Layer Deposition (MLD) method of forming a film in a level of molecular layers are known. With these ALD method and MLD method, it is possible to form a layer having a predetermined thickness. Therefore, it is possible to form a film having a good coverage property where a uniform thickness is obtainable by depositing the atomic or molecular layers.

According to "Research-Atomic Layer Deposition", [online], Tufts Plasma Engineering Laboratory, Internet URL: www.ece.tufts.edu/~hopwood/lab/PEALD.htm, Search date: Jul. 27, 2012, and Jun-ichi Nishizawa, et. al, "Journal of the Electrochemical Society", 149 (7), G399-G402, 2002, methods of depositing films using the ALD method and the MLD method are disclosed as methods of depositing films. According to the methods of depositing films, at first, under an atmosphere of 450° C., disilane ($Si_2H_6$) is supplied onto a wafer using disilane ($Si_2H_6$) as reactive species (precursor) to thereby form a molecular layer of $SiH_3$ on the wafer by adsorption. Thereafter, the atmosphere is increased to 550° C. to thereby break a Si—H bond. Thus, a bare silicon atomic layer is left on the wafer.

SUMMARY OF THE INVENTION

Accordingly, embodiments of the present invention may provide a new and useful film deposition apparatus and a method of depositing a film.

According to an aspect of the present invention, there is provided a method of depositing a film for forming a silicon film on a substrate, which is mounted on a turntable and can pass by rotation through a first process area and a second process area, which are separately arranged along a peripheral direction in a chamber substantially in a cylindrical shape set to have a first temperature capable of cutting a Si—H bond, including a molecular layer deposition step of supplying a $Si_2H_6$ gas set to have a second temperature less than the first temperature when the substrate passes through the first process area thereby forming a $SiH_3$ molecular layer on a surface of the substrate; and a hydrogen desorption step of causing the substrate, on the surface of which the $SiH_3$ molecular layer is formed, to pass through the second process area maintained to have the first temperature thereby cutting the Si—H bond and leaving only a silicon atomic layer on the surface of the substrate.

Objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 6A illustrates a reaction mechanism of a method of depositing a film of the embodiment where an exemplary $SiH_3$ molecular layer depositing process performed in a first process area P1 is illustrated;

FIG. 6B illustrates the reaction mechanism of the method of depositing the film of the embodiment where an exemplary hydrogen desorption process performed in a second process area P2 is illustrated;

FIG. 9 illustrates an experimental result for checking a CVD reaction generating area in a case of performing the method of depositing the film of the embodiment;

FIG. 11 illustrates a result of performing a method of depositing the film of a working example 2 and a result of running a film deposition apparatus of the working example 2.

DETAILED DESCRIPTION OF EMBODIMENTS

Figure 1:
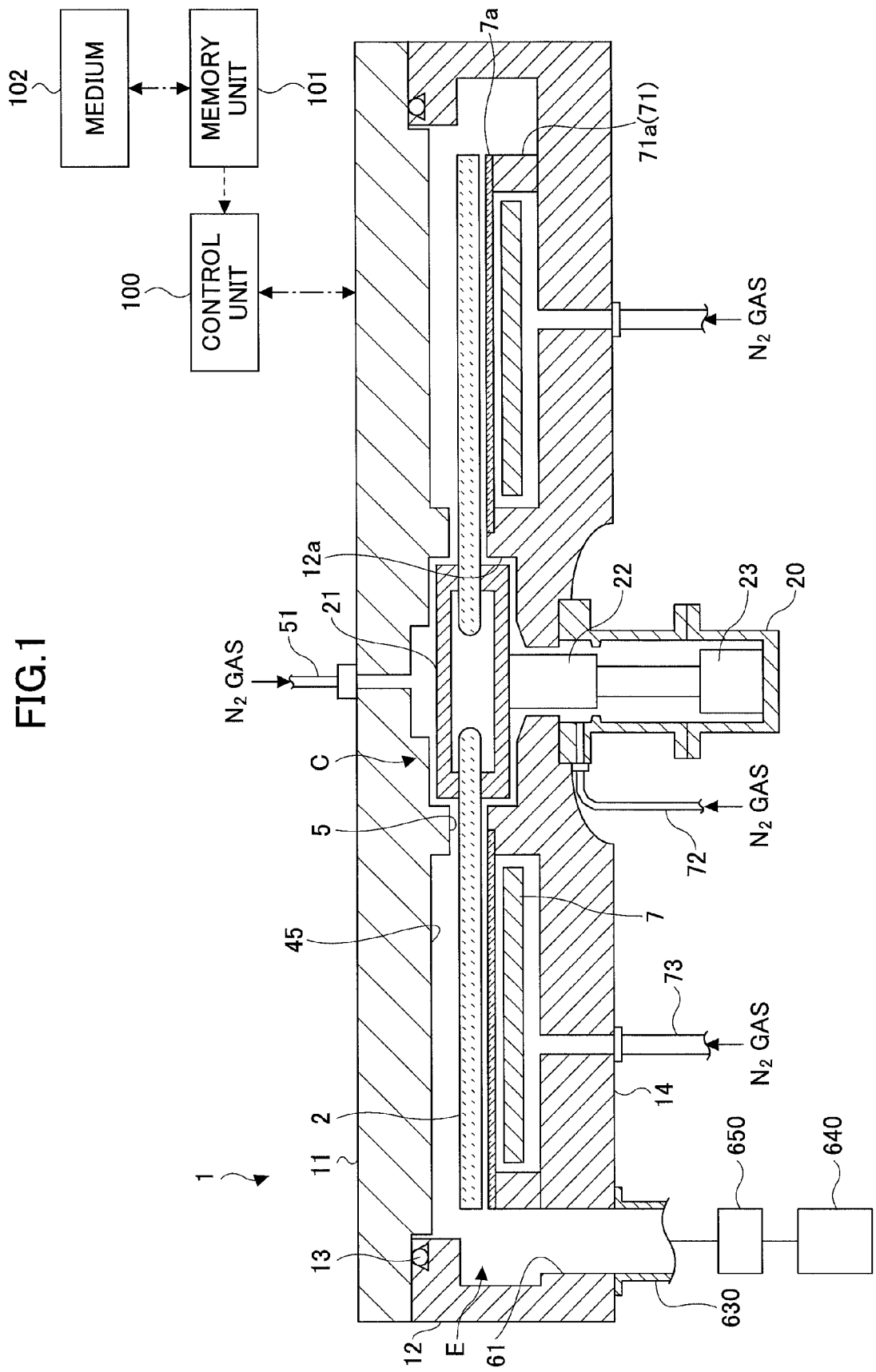
FIG. 1 is a cross-sectional view illustrating an exemplary film deposition apparatus of an embodiment.

A description is given below, with reference to FIG. 1 through FIG. 11 of embodiments of the present invention.

Where the same reference symbols are attached to the same parts, repeated description of the parts is omitted.

The above method of depositing the silicon film using the above ALD or MLD method can be experimentally performed. However, it is necessary to alternately increase or decrease the temperature inside a treatment chamber between 450° C. and 550° C. Therefore, there is a problem that a time is required to control the temperature inside the treatment chamber and the method of depositing the silicon film is not applicable to a process of mass production.

For example, in order to form a molecular layer of $SiH_3$ on a wafer by adsorption, it is indispensable to set the temperature inside the treatment chamber to about 450° C. while silicon is exposed to the surface of the wafer. Only under the conditions, silicon of $SiH_3$ is adsorbed on the wafer, on which silicon is exposed. For example, if the temperature inside the treatment chamber is equal to or greater than 500° C., a Chemical Vapor Deposition (CVD) reaction occurs where $SiH_3$ reacts with $SiH_3$. However, there does not occur a MLD reaction or an ALD reaction, with which silicon adsorbs onto silicon. Although the gas supplied inside the treatment chamber is a disilane ($Si_2H_6$) gas, the gas is immediately thermally decomposed inside the treatment chamber to be in a state of $SiH_3$. Thus, the above adsorption reaction occurs.

On the other hand, under the state where $SiH_3$ adsorbs onto silicon on the wafer, there are three Si—H bonds for each $SiH_3$ molecule. Therefore, silicon cannot be exposed on the surface of the wafer without desorbing hydrogen by cutting the Si—H bonds. In order to break the Si—H bonds, it is necessary to heat at the temperature of about 550° C. Therefore, the process of setting the temperature inside the treatment chamber to about 550° C. is indispensable.

As described, in the above method of depositing the film, the temperature difference between the increment and the decrement of about 100° C. is required to be alternately performed. Thus, the process requires a very long time. With the above process, productivity is too low to apply the process to an actual semiconductor manufacturing process with which semiconductor devices are mass-produced.

Therefore, the embodiments of the present invention provides a method of depositing a film and a film deposition apparatus, with which a film deposition process of depositing a silicon film using the above ALD or MLD method is performed, without increasing or decreasing the atmospheric temperature inside a treatment chamber to form silicon films having even film thicknesses with high productivity.

A description is given below, with reference to the figures of the embodiments of the present invention.

In the embodiments described below, the reference symbols typically designate as follows:
1: chamber;
2: turntable;
4: convex portion;
5: ring-shaped protruding portion;
7: heater unit;
10: transfer arm;
11: ceiling plate;
12: chamber body;
24: circular concave portion (substrate mounting portion);
31: reaction gas nozzle;
41, 42: separation gas nozzle;
44: low ceiling surface;
45: high ceiling surface;
P1: first process area;
P2: second process area;
D1: first separating area;
D2: second separating area; and
W: wafer.
(Film Deposition Apparatus)

Figure 2:
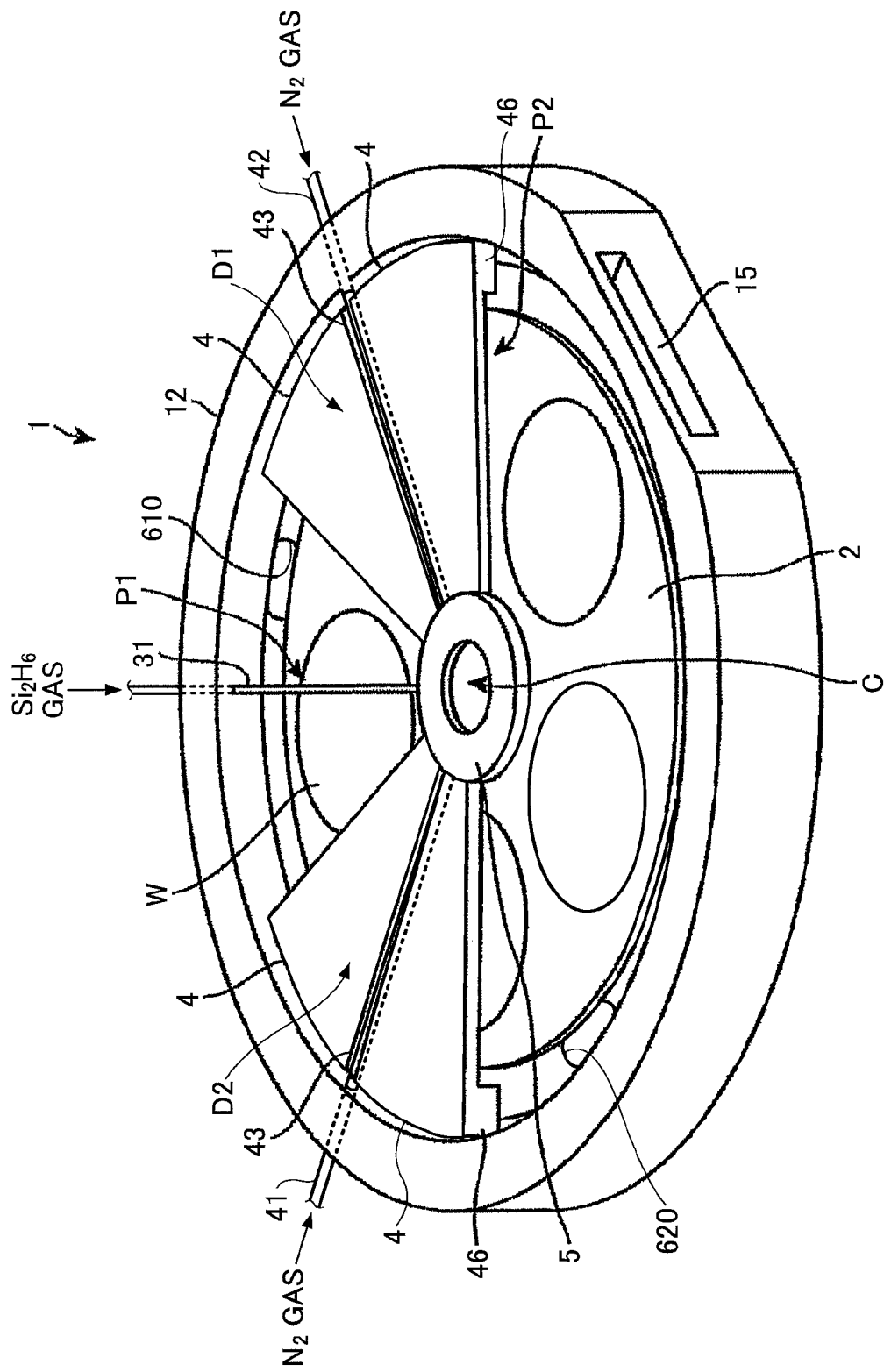
FIG. 2 is a perspective view illustrating an exemplary inner structure of the film deposition apparatus of the embodiment.
Figure 3:
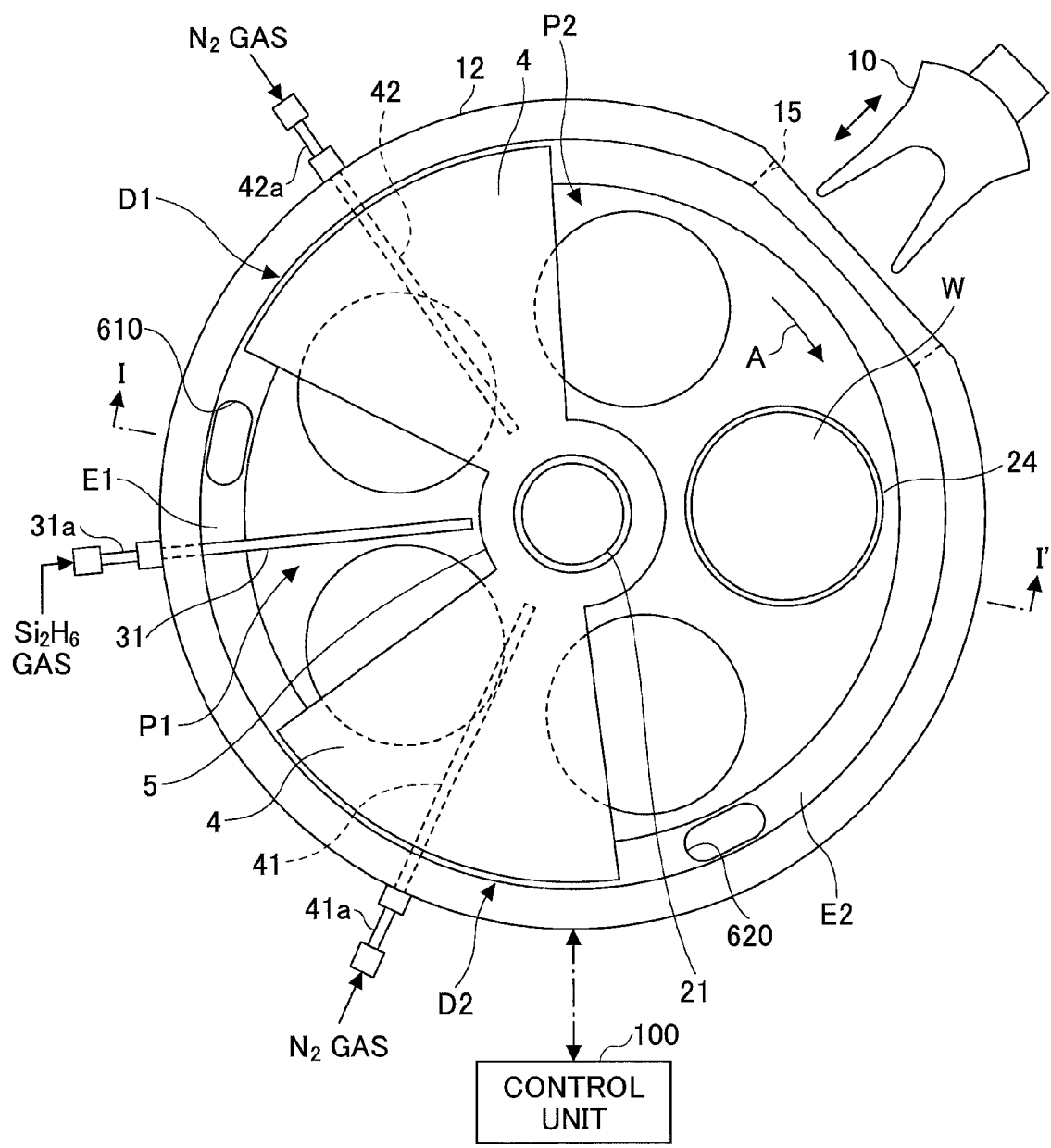
FIG. 3 is a plan view illustrating an exemplary inner structure of the film deposition apparatus of the embodiment.

FIG. 1 is a cross-sectional view illustrating an exemplary film deposition apparatus of the embodiment. FIG. 2 is a perspective view illustrating an exemplary inner structure of the film deposition apparatus of the embodiment. FIG. 3 is a plan view illustrating an exemplary inner structure of the film deposition apparatus of the embodiment.

Referring to FIGS. 1 to 3, the film deposition apparatus of the embodiment includes a chamber 1 having a substantially circular shape in its plan view and a flattened shape in its side view, and a turntable 2 having the rotational center in the center of the chamber 1. Referring to FIG. 1, the chamber 1 includes a chamber body 12 having a bottomed cylindrical shape, and a ceiling plate 11, which is detachably provided to the upper surface of the chamber body 12 through a sealing member 13 such as an O-ring to hermetically seal the chamber 1.

The rotary table 2 is fixed by a core unit 21 in a cylindrical shape at the center portion. The core unit 21 is fixed to the upper end of a rotational shaft 22 extending in the vertical direction. The rotational shaft 22 penetrates a bottom portion 14 of the chamber 1. The lower end of the rotational shaft 22 is attached to a driving mechanism 23, which causes the rotational shaft 22 to rotate around the vertical axis of the rotational shaft. The rotational shaft 22 and the driving mechanism 23 are accommodated in a cylindrical case body 20 whose upper surface is opened. A flange on the upper surface of the case body 20 is hermetically attached to the lower surface of a bottom portion 14 of the chamber 1 to maintain a gastight state between the inner atmosphere and the outer atmosphere of the case body 20. The turntable 2 may be called a "susceptor 2".

A heater unit 7 as a heating means is provided in a space between the turntable 2 and the bottom portion 14. The heater unit 7 has an annular shape and maintains the temperature of the inside of the chamber to be constant by applying heat from a lower side of the turntable 2. In the film deposition apparatus of the embodiment, the temperature of the inside of the chamber 1 is maintained to be the predetermined temperature enabling to break an Si—H bond. Specifically, because the Si—H bond is broken at a temperature of about 550° C., the heater unit 7 heats the inside of the chamber 1 so that the temperature inside the chamber 1 becomes 540° C. to 580° C., preferably 550° C. to 570° C.

Referring to FIG. 2 and FIG. 3, circular concave portions 24 for receiving a plurality of substrates, for example 5 wafers are illustrated in FIGS. 2 and 3, are formed on a surface portion of the turntable 2 along a rotational direction (a peripheral direction) of the turntable 2. Within the embodiment, a case where a semiconductor wafer (hereinafter, referred to as a "wafer") W made of silicon is used as the substrate is exemplified. FIG. 3 illustrates a state where the wafer W is mounted only one circular concave portion 24 for convenience. The inner diameter of the circular concave portion 24 is slightly greater than the diameter of the wafer W by, for example, 2 mm. The depth of the circular concave portion 24 is substantially equal to the thickness of the wafer W. Therefore, when the wafer W is accommodated in the circular concave portion 24, the height of the surface of the wafer W is substantially the same as the height of the surface of the turntable in an area where the wafer is mounted. Through holes (not illustrated), through which lift pins for lifting up and down the back surfaces of the wafers by supporting the back surface, penetrate the bottom surfaces of the circular concave portions 24. For example, the number of the lift pins is three.

FIGS. 2 and 3 illustrate the structure inside the chamber 1. For convenience, the ceiling plate 11 is omitted in FIGS. 2 and 3. As illustrated in FIGS. 2 and 3, a reaction gas nozzle and separation gas nozzles 41, 42, which are made of, for example, quartz, are arranged above the turntable 2 while interposing gaps in a peripheral direction of the chamber 1 (a rotational direction along an arrow A in FIG. 3 of the turntable 2). In FIGS. 2 and 3, the separation gas nozzle 41, the reaction gas nozzle 31, and the separation gas nozzle 42 are arranged in this order in a clockwise direction (the rotational direction of the turntable 2) from a transfer opening 15 described below. These nozzles 31, 41, and 42 are attached to the chamber body 12 by fixing gas introducing ports 31a, 41a, and 42a (see FIG. 3), which are base portions of the nozzles 31, 41, and 42, respectively, to the outer peripheral wall of the chamber 1 so as to horizontally extend along radii of the chamber body 12. Thus, these nozzles 31, 41, and 42 are introduced inside the chamber 1 from the outer peripheral wall of the chamber 12.

Within the embodiment, the reaction gas nozzle 31 is connected to a supplying source (not illustrated) of a $Si_2H_6$ gas as a reaction gas through a pipe arrangement, a flow controller, or the like (not illustrated). The separation gas nozzles 41 and 42 are connected to a supplying source (not illustrated) of a nitrogen ($N_2$) gas as a separation gas through a pipe arrangement, a flow controller, or the like (not illustrated).

A plurality of gas ejection holes 33 opening toward the turntable 2 are arranged in the reaction gas nozzle 31 along the longitudinal direction of the reaction gas nozzle 31 at an interval of, for example, 10 mm. In area below the reaction gas nozzle 31, there is a first process area P1 used to cause $SiH_3$, which is decomposed from $Si_2H_6$, to adsorb onto the wafer W. Further, in an area without facing the reaction gas nozzle 31 and being positioned opposite to the first process area P1, there is a second process area used to cause H to desorb from $SiH_3$, which adsorbs onto the wafer W.

Two separating areas D1 and D2 are provided between the first process area P1 and the second process area P2. Since the first process area P1 and the second process area P2 are oppositely arranged, the first and second separating areas D1 and D2 provided on both sides in the peripheral direction of the first process area P1 are also provided on both sides in the peripheral direction of the second process area P2. Said differently, the first process area P1 and the second process area P2 are provided by being mutually separated by the first and second separating areas D1 and D2. Within the embodiment, in a case where the turntable 2 rotates in a clockwise direction, while a wafer W mounted on the turntable 2 is carried from the first process area P1 to the second process area P2, the wafer W passes through the first separating area D1. While the wafer W mounted on the turntable 2 is carried from the second process area P2 to the first process area P1, the wafer W passes through the second separating area D2.

When the turntable 2 rotates in the clockwise direction, the wafer W mounted on the circular concave portion 24 continuously and sequentially passes through the first process area P1, the first separating area D1, the second process area P2, and the second separating area D2. Although a detailed description of the method of depositing the film is given later, a summary of the method of depositing a film is described. While maintaining the temperature inside the chamber 1 at a temperature (about 550° C.) of enabling cutting the Si—H bond, a disilane gas (a $Si_2H_6$ gas) is supplied from the reaction gas nozzles 3 when the wafer W passes through the first process area P1. Then, thermally decomposed $SiH_3$ adsorbs onto the surface of the wafer W. Since the disilane gas is decomposed at about 450° C. to $SiH_3$, the disilane gas is easily decomposed under the temperature of about 550° C. of the embodiment. The surface of the wafer W is formed by silicon. Si on the wafer Si adsorbs onto Si of $SiH_3$ obtained by decomposing the disilane gas. Thereafter, the wafer W enters into the first separating area D1 by the rotation of the turntable 2. The surface of the wafer W is purged by a $N_2$ gas. With this, excessive molecules do not attach to the $SiH_3$ molecular layer and the condition of the molecular layers is maintained. Said differently, excessive CVD reaction or the like does not occur. Subsequently, the turntable 2 further rotates and the wafer W enters into the second process area P2. There is no gas nozzle in the second process area P2. The second process area P2 forms a space having a predetermined constant temperature. Inside the second process area P2, Si—H is broken and only a Si atomic layer is left on the surface of the wafer W. When the turntable 2 further rotates, the wafer W enters into the second separating area D2. In the second separating area D2, a purge gas is supplied to the wafer W and dust or the like is removed from the surface of the wafer W. When the turntable 2 further rotates, the wafer W enters into the first process area P1. When the wafer W enters into the first process area P1, the silicon atomic layer is formed on the surface of the wafer W and the dust or the like is removed from the surface of the wafer W. Therefore, by similarly repeating the above processes, a silicon film can be formed on the surface of the wafer.

By continuously performing the above sequential processes with rotations of the turntable 2, it becomes possible to form the silicon film having a predetermined thickness on the surface of the wafer W. The film deposition apparatus of the embodiment is formed so as to perform the above film deposition process. Hereinafter, each of constituent elements of the film deposition apparatus is described in detail.

Figure 4:
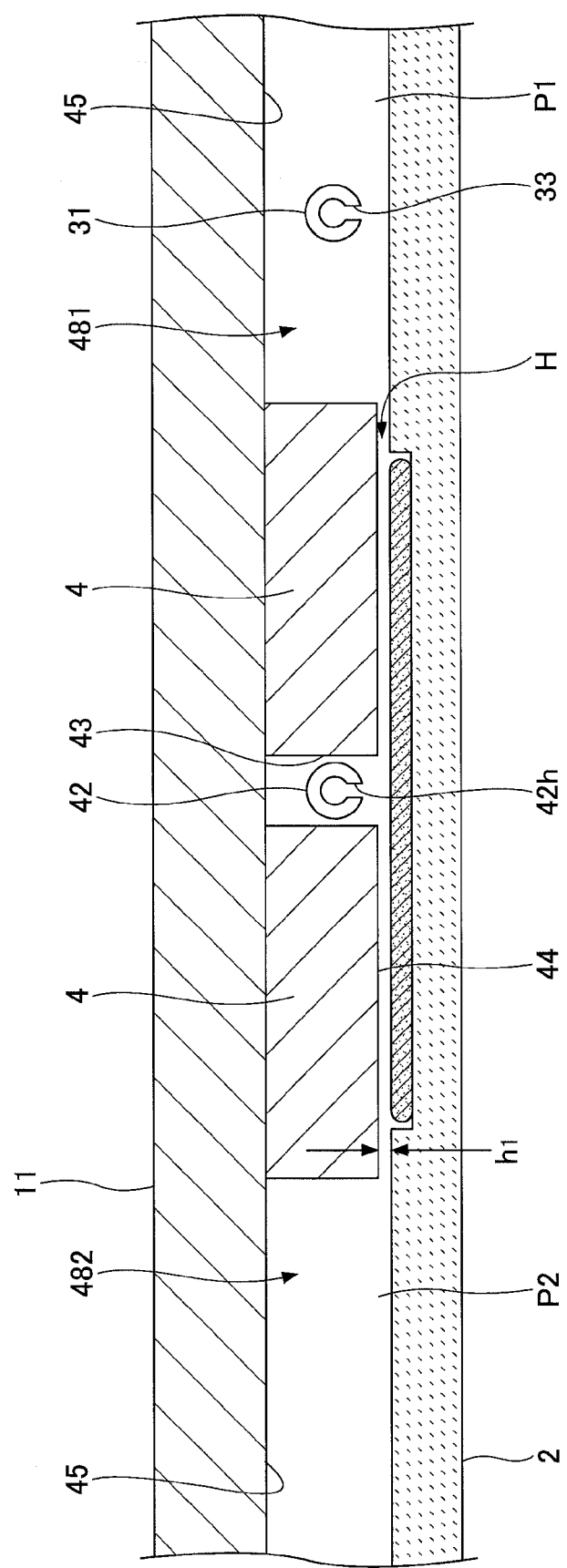
FIG. 4 is a cross-sectional view of a part of a chamber taken along a concentric circle of a turntable from the first process area to the second process area.

FIG. 4 is a cross-sectional view of a part of the chamber 1 taken along a concentric circle of the turntable 2 from the first process area P1 to the second process area P2. As illustrated, a convex portion 4 is attached onto the back surface of the ceiling plate 11. There are a low ceiling surface 44 (a first ceiling surface), which is a lower surface of the convex portion 4, and a high ceiling surface 45 (a second ceiling surface), which is a higher surface of the convex portion 4 and is positioned on both sides of the low ceiling surface 44 in a peripheral direction. The low ceiling surface 44 is shaped like a sector having a peripheral edge portion broken so as to be formed like a circular arc in its plan view. Further, as illustrated in FIG. 4, a groove portion 43 is formed in a center of the convex portion 4 in its peripheral direction so as to extend in a radius direction. The separation gas nozzle 42 is accommodated inside the groove portion 43. Another groove portion 43 is similarly formed in another convex portion 4. The separation gas nozzle 41 is accommodated in the other groove portion 43. In a space below the high ceiling surface 45 of the first process area P1, the reaction gas nozzle 31 is provided. On the other hand, the temperature of the space below the high ceiling surface 45 of the second process area P2 is maintained constant. However, since no gas is supplied, no gas nozzle is provided. The reaction gas nozzle 31 is provided in the vicinity of the wafer W and apart from the ceiling surface 45. For convenience of explanation, as illustrated in FIG. 4, the space below the ceiling surface 45 where the reaction gas nozzle 31 is provided is designated by a reference symbol 481, and the space below the ceiling surface 45 where no gas nozzle is provided is designated by a reference symbol 482.

A plurality of gas injection holes 41h (see FIG. 4) opening toward the turntable 2 are provided in the separation gas nozzles 41 and 42 which are accommodated in the groove portions 43 of the convex portions 4. The gas injection holes 42h are arranged along the longitudinal directions of the separation gas nozzles 41 and 42 at an interval of, for example, 2 mm.

A separation space H, which is narrow, is formed between the ceiling surface 44 and the turntable 2. When the $N_2$ gas is supplied from the gas ejection holes 42h of the separation gas nozzle 42, the $N_2$ gas flows toward the spaces 481 and 482 through the separation space H. At this time, the volume of the separation space H is less than the volume of the spaces 481 and 482. Therefore, the pressure of the separation space H is relatively higher than the pressure in the spaces 481 and 482. Said differently, the separation space H having a high pressure is formed between the spaces 481 and 482. Further, the $N_2$ gas flowing into the spaces 481 and 482 from the separation space H functions as a counter flow against the $Si_2H_6$ gas in the first process area P1 flowing into the second process area P2. Therefore, the separation space H prevents the $Si_2H_6$ gas from flowing from the first process area P1 to the second process area P2 to separate the first process area P1 from the second process area P2. Inside the chamber 1, the $Si_2H_6$ gas is prevented from moving into the second process area P2, which is maintained at a high temperature, without receiving and/or sending the gas. Thus, it is possible to prevent a CVD reaction from occurring.

It is preferable to set the height h1 of the ceiling surface 44 relative to the upper surface of the turntable suitable for increasing the pressure in the separation space H higher than the pressure in the spaces 481 and 482 in consideration of the pressure inside the chamber 1 at the time of forming the film, the rotational speed of the turntable 2, the supply amount of the separation gas (the $N_2$ gas), or the like.

As illustrated in FIGS. 2 and 3, a ring-like protruding portion 5 surrounding the outer periphery of the core portion 21, to which the turntable 2 is fixed, is provided under the lower surface of the ceiling plate 11. The ring-shaped protruding portion 5 is continuously formed from the convex portions 4 at portions on a side of the rotation center of the convex portions 4. The lower surface of the ring-shaped protruding portion 5 has substantially the same height as that of the ceiling surface 44.

FIG. 1 is a cross-sectional view taken along a line I-I' of FIG. 3. FIG. 1 illustrates an area where the ceiling surface 45 is provided.

Figure 5:
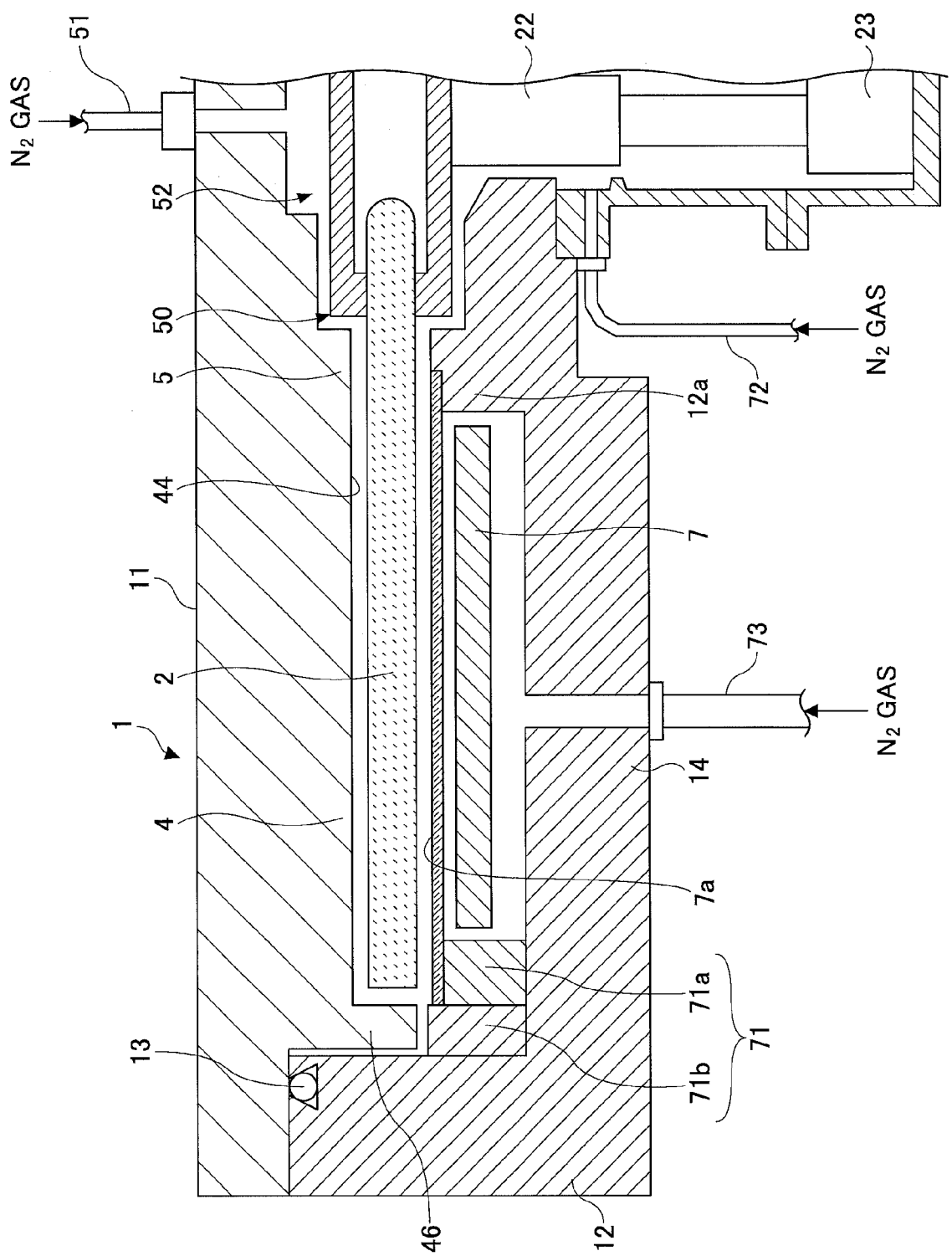
FIG. 5 is a cross-sectional view of an area including a ceiling surface of a film deposition apparatus.

FIG. 5 is a cross-sectional view of an area including the ceiling surface 44 of the film deposition apparatus. As illustrated in FIG. 5, a peripheral edge portion (a portion of the chamber 1 on the outer edge side) of the convex portion 4 in a sector-like shape has a bent portion 46 bent in a L-like shape so as to face the outer end surface of the turntable 2. The bent portion 46 restricts the reaction gas ($SiH_6$) from intruding into the first and second separating areas D1 and D2 to thereby restrict generation of the CVD reaction in a manner similar to the convex portion 4. The convex portion 4 in the sector-like shape is provided in the ceiling plate 11. Because the ceiling plate 4 can be detached from the chamber body 12, there is a small gap between the outer peripheral surface of the bent portion 46 and the chamber body 12. A gap between the inner peripheral surface of the bent portion 46 and the outer edge surface of the turntable 2 and a gap between the outer peripheral surface of the bent portion 46 and the chamber body 12 are set to have a dimension, for example, similar to that of a gap between the ceiling surface 44 and the upper surface of the turntable 2.

As illustrated in FIG. 5, the inner peripheral wall of the chamber body 12 has a vertical surface in the vicinity of the outer peripheral surface of the bent portion 46 in the first and second separating areas D1 and D2. However, as illustrated in FIG. 5, the inner peripheral wall of the chamber body 12 is recessed outward in a portion other than the first and second separating areas D1 and D2, for example, from a portion facing the outer edge surface of the turntable 2 toward the bottom portion 14. Hereinafter, for convenience of explanation, a recessed portion having a substantially rectangular shape in its cross-sectional view is referred to as an evacuation area E. Specifically, as illustrated in FIG. 3, the evacuation area communicating with the first process area P1 is referred to as a first evacuation area and the evacuation area communicating with the second process area P2 is referred to as a second evacuation area E2. A first evacuation port 610 and a second evacuation port 620 are respectively formed in the bottom portions of the first and second evacuation areas E1 and E2, as illustrated in FIGS. 1 to 3. The first and second exhaust ports 610 and 620 may be connected to a vacuum pump 640 being a vacuum exhausting means through exhaust pipes 630. Referring to FIG. 1, a reference symbol 650 designates a pressure controller.

Referring to FIG. 5, the heater unit 7 being a heating means is provided in the space between the turntable 2 and the bottom portion 14 of the chamber 1. In the film deposition apparatus of the embodiment, the wafer W on the turntable 2 is heated through the turntable 2 to have a temperature (for example, 550° C.) enabling to break a Si—H bond of the $SiH_3$ molecular layer formed on the surface of the wafer W. On the lower side of the turntable 2, a cover member 71 like a ring is provided to prevent the gas from intruding into a lower area lower than the turntable 2 by separating an atmosphere between an upper space upper than the turntable 2 and the evacuation areas E1 and E2 from an atmosphere where the heater unit 7 is installed. The cover member 71 includes an inner member 71a provided in a position vertically corresponding to the outer edge portion of the turntable 2 and to an outer peripheral side outer than the outer edge portion of the turntable 2, and an outer member 71b provided between the inner member 71a and the inner wall surface of the chamber 1. The outer member 71b is provided in the vicinity of the bent portion 46 formed on the outer edge portion of the convex portion 4 in the first and second separating areas D1 and D2 under the bent portion 46. The inner member 71a surrounds the entire periphery of the heater unit 7 and is positioned under the outer edge portion and a portion slightly outer than the outer edge portion.

A part of the bottom portion 14 closer to the rotation center than the space where the heater unit 7 is arranged has the ring-like portion 12a protruding upward toward the lower surface of the core portion 21 provided on the lower surface of the turntable 2 and in the vicinity of the center portion of the turntable 2. A narrow space is provided between the ring-shaped protruding portion 12a and the core portion 21. A gap between the inner peripheral surface of a through hole for the rotational shaft 22 penetrating through the bottom portion 14 and the rotational shaft 22 is small. The narrow space including the small gap communicates with the inside of the casing 20. A purge gas supplying pipe 72 is provided in the case body 20 so that the $N_2$ gas being the purge gas is supplied into the narrow space to purge the narrow space. In the bottom portion 14 of the chamber 1, a plurality of purge gas supplying pipes 73 are provided to purge a space where the heater unit 7 is arranged under the heater unit 7 at intervals of a predetermined angle in the peripheral direction (only one purge gas supplying pipe 73 is illustrated in FIG. 5). Further, a lid member 7a is provided between the heater unit 7 and the turntable 2. The lid member 7a restricts the gas from intruding into an area where the heater unit 7 is installed by covering between the inner peripheral wall of the outer member 71b (the upper surface of the inner member 71a) and the upper end portion of the ring-shaped protruding portion 12a along the peripheral direction. The lid member 7a is made of, for example, quartz.

A separation gas supplying tube 51 is connected to a center portion of the ceiling plate 11 of the chamber 1. The separation gas of the $N_2$ gas is supplied to a space 52 between the ceiling plate 11 and the core portion 21. The separation gas supplied to the space 52 is discharged toward the outer periphery of the turntable 2 along the surface on the side of a wafer mounting area of the turntable 2 through the narrow gap 50 between the ring-shaped protruding portion 5 and the turntable 2. The space 50 is maintained to have a pressure higher than those of the spaces 481 and 482 by the separation gas. Therefore, it is possible to restrict the $Si_2H_6$ gas supplied to the first process area P1 from intruding into the second process area P2 after passing through a center area C by providing the space 50. The space 50 (or the center area C) can function in a manner similar to the separation space H (or the first and second separating areas D1 and D2.

As illustrated in FIGS. 2 and 3, a transfer opening 15 is formed in the side wall of the chamber 1 for serving and receiving the wafer W being the substrate between a transfer arm 10 provided outside and the turntable 2. The transfer opening 15 is opened and closed by a gate valve (not illustrated). The wafer W is served and received between the circular concave portion 24, which is the wafer mounting area of the turntable 2, and the transfer arm 10 at a position of the turntable 2 facing the transfer opening 15. Further, a lift pin (not illustrated) for lifting the wafer W from the back surface side to serve and receive the wafer W and a lifting mechanism (not illustrated) for lifting the lift pin (not illustrated) are provided at a portion of the turntable 2 corresponding to the position where the wafer W is served and received. The lift pin penetrates through the circular concave portion 24 of the turntable 2.

Further, as illustrated in FIG. 1, the film deposition apparatus of the embodiment includes a control unit 100 including a computer for controlling operations of the entire film deposition apparatus. In a memory of the control unit 100, a program causing the film deposition apparatus to perform a method of depositing a film described below under a control of the control unit 100. This program includes groups of steps for performing the method of depositing the film as described below and is stored in a medium 102 such as a hard disk, a compact disk, a magnet-optical disk, a memory card, a flexible disk, or the like. The program is read in a memory unit 101 and is installed inside the control unit 100.

(Method of Depositing Film)

Next, the method of depositing a film using the above film deposition apparatus as an example is described. Within the embodiment, a silicon wafer is used as the wafer W. Further, the disilane gas is supplied from the reaction gas nozzle 31.

At first, a gate valve (not illustrated) is opened. The wafer W is served into the circular concave portion 24 of the turntable 2 through the transfer opening 15 (see FIGS. 2 and 3) by the transfer arm 10 (see FIG. 3) provided outside the chamber 1. When the circular concave portion 24 is stopped at a position facing the transfer port 15, the lift pin (not illustrated) lifts up or down from the bottom portion side of the chamber 1 through the through hole in the bottom surface of the circular concave portion 24 to serve or receive the wafer W. The wafer W is served and received while the turntable 2 is intermittently rotated to thereby mount the wafers W inside the circular concave portions 24 equal to 5.

Subsequently, the gate valve is closed and the inside of the chamber 1 is evacuated to have a degree of vacuum, to which the vacuum pump 640 can evacuate. Thereafter, the $N_2$ gas as the separation gas is discharged from the separation gas nozzles 41 and 42 at predetermined flow rates, and the $N_2$ gas is discharged from the separation gas supplying pipe 51 and the purge gas supplying pipes 72, 72 at predetermined flow rates.

At this time, a pressure control means 650 (see FIG. 1) controls the inside of the chamber 1 to have a predetermined process pressure. Subsequently, the wafer W is heated to be, for example, 550° C. by the heater unit 7 while the turntable 2 is rotated at a rotational speed of, for example, 20 rpm in a clockwise direction. Hereinafter, the temperature is correctly that of the heater unit 7. However, for easier understanding, it is assumed that the atmosphere inside the chamber 1 is set to be equal to a setup temperature of the heater unit 7.

Thereafter, the $Si_2H_6$ gas is supplied from the reaction gas nozzle 31 (see FIGS. 2 and 3) in the first process area P1.

FIGS. 6A and 6B illustrate a reaction mechanism of a method of depositing a film of the embodiment.

FIG. 6A illustrates an exemplary $SiH_3$ molecular layer depositing process performed in the first process area P1. Referring to FIG. 6A, when $Si_2H_6$ is supplied, Si atoms of $SiH_3$ molecular layers obtained by thermally decomposing $Si_2H_6$ adsorb onto and bind to the surface of the silicon wafer W. Said differently, the $SiH_3$ molecular layers are formed on the surface of the wafer W by a so-called ALD method or a so-called MLD method. The above reaction is ordinarily called the ALD method. However, $SiH_3$ is chemically not an atom but a molecular. Therefore, with the embodiment, $SiH_3$ is classified as the molecular layers, and the ALD method and the MLD method are not exactly distinguished to thereby totally call the ALD method or the MLD method.

The above reaction is ordinarily generated only when bear silicon exists under an atmosphere of about 450° C. and under conditions where silicon can directly bind to silicon. In the film deposition apparatus of the embodiment, because the temperature inside the chamber 1 is set to about 550° C., this ALD reaction cannot occur with an ordinary process. However, with the method of depositing the film of the embodiment, the $Si_2H_6$ gas supplied from the reaction gas nozzle 31 has an ambient (normal) temperature. ambient temperature The ambient temperature is within a range of 20° C. to 30° C., ordinarily about 25° C. By supplying the $Si_2H_6$ gas having the ambient temperature toward the wafer at close range, the temperature in a vicinity of the surface of the wafer W can be instantaneously reduced. Thus, the temperature condition of 450° C. is instantaneously prepared. As illustrated in FIG. 4, in the first process area P1, the ceiling surface 45 is higher than the ceiling surfaces of the first and second separating areas D1 and D2. However, the height of the reaction gas nozzle 31 is substantially the same as the height of the separation gas nozzle 42 and is close to the surface of the wafer W. Therefore, the $Si_2H_6$ gas supplied from the reaction gas nozzle 31 reaches the surface of the wafer W before the temperature of the $Si_2H_6$ gas becomes the temperature of the ambient atmosphere. Therefore, a Molecular Layer Deposition (MLD) reaction ordinarily occurring under the atmosphere of about 450° C. is produced.

At the temperature inside the chamber 1 of 550° C., a CVD reaction is ordinarily produced in a case where the $Si_2H_6$ gas is supplied. Therefore, even if $SiH_3$ adsorbs onto the surface of the silicon wafer W, a $SiH_3$ film probably deposit over there by the CVD reaction. However, with the method of depositing the film of the embodiment, the wafer W having the $SiH_3$ molecular layer on it moves into the first separating area D1 without producing the above needless CVD reaction since the turntable 2 is rotated. Since the purge gas of $N_2$ is supplied inside the narrow space to prevent the $Si_2H_6$ gas from flowing into the first separating area D1, it is possible to prevent the $SiH_3$ film from further depositing onto the surface of the $SiH_3$ molecular layer.

Said differently, in the method of depositing the film, the $SiH_3$ molecular layer is formed by instantaneously preparing the conditions where the molecular layer deposition reaction is produced in the vicinity of the surface of the wafer W within the first process area P1. After forming the $SiH_3$ molecular layer, the wafer W is moved to the first separating area D1 by the rotation before the needless CVD reaction is produced. By appropriately combining the supply of the $Si_2H_6$ gas having the ambient temperature and the rotational movement of the wafer W, even under the high temperature atmosphere where a Si—H bond is broken, the molecular layer deposition reaction of depositing the $SiH_3$, which is ordinarily produced only under a lower temperature atmosphere, is produced to thereby form the $SiH_3$ molecular layer.

Further, since the first process area P1 forms the $SiH_3$ molecular layer using the above molecular layer deposition reaction, the first process area P1 may be called a molecular layer deposition area, a $SiH_3$ adsorption area, an ALD area, or the like.

Within the embodiment, although the $Si_2H_6$ gas having the ambient temperature is supplied as an example, if a Si—H bond can be broken at another temperature, which is lower than 550° C., the temperature of the supplied gas may be the another temperature. For example, an appropriate gas supply temperature in conformity with the conditions can be set within a range of 0 to 50° C.

Further, the first separating area D1 can prevent the $Si_2H_6$ gas from flowing from the first process area P1 due to the structure illustrated in FIGS. 4 and 5. Therefore, the wafer passes through the first separating area W1 while the purge gas such as $N_2$ is supplied onto the surface of the wafer W.

FIG. 6B illustrates an exemplary hydrogen desorption process performed in the second process area P2. As illustrated in FIG. 6B, in the second process area P2, hydrogen is desorbed by cutting Si—H bonds. With this, Si of the $SiH_3$ molecular layer remains on the surface of the silicon wafer W to thereby form a silicon atom layer. A supply of a gas, which causes the temperature of the second process area P2 to be reduced, or the like is not performed in the second process area P2, and the temperature is maintained to be about 550° C., which is necessary to break a Si—H bond. While the wafer W passes through the space of the second process area, which is maintained at a predetermined temperature necessary to break a Si—H bond, hydrogen is desorbed and a bare silicon atomic layer is formed.

At this time, the length of the second process area P2 in the peripheral direction and the rotational speed of the turntable 2 are determined so that a Si—H bond is broken while the wafer W passes through the second process area P2. Ordinarily, the first process area P1 is made short to prevent the CVD reaction. On the contrary, the second process area P2 is made longer than the first process area P1 so that the reaction of desorbing hydrogen is securely produced.

In the second process area P2, a nozzle is not used to perform the method of depositing the film of the embodiment. However, the nozzle may be installed before or after the method of depositing the film of the embodiment or for another purpose. In this case, the nozzle may be prepared depending on a usage and a predetermined purpose. For example, in a case where oxidation or a plasma process is performed to form a seed layer on the surface of the wafer W, an oxidation gas supply nozzle or a plasma processing apparatus may be installed. When the method of depositing the film of the embodiment is performed, by stopping the operations of the oxidation gas supply nozzle or the plasma processing apparatus, the method of depositing the film can be performed without any problem.

Since the second process area P2 is provided to break the above Si—H bonds and to form the Si atomic layer by desorbing hydrogen, the second process area P2 may be called a hydrogen desorption area, a hydrogen dissociation area, a Si—H bond breaking area, or the like.

The wafer passing through the second process area P2 moves to the second separating area D2 by the rotation. In the second separating area D2, the purge gas such as $N_2$ is supplied onto the surface of the wafer W to thereby prevent needless dust or the like from attaching onto the silicon atomic layer.

The wafer W, which has passed through the second separating area D2 and has the bear silicon film on its surface, enters into the first process area P1 again by the rotation of the turntable 2. A $SiH_3$ molecular layer is formed on the wafer W is formed by the above molecular layer deposition method, and processes similar to the above are repeated. By rotating the turntable 2 a plurality of times, the above silicon film forming process is repeated. Resultantly, a silicon film having a predetermined film thickness is obtainable.

A silicon film having a high evenness can be formed using an ALD method with a high productivity while maintaining the temperature setup inside the chamber the temperature inside the chamber 1 constant in the method of depositing the film of the embodiment by appropriately combining, the temperature setup inside the chamber 1, with which a Si—H bond can be broken, the supply of silane gas having a temperature lower than the above temperature inside the chamber 1, and the prevention of the CVD reaction with the rotation of the turntable.

In the above explanation, an example that the temperature inside the chamber is about 550° C. is described. However, it is sufficient that the heater unit 7 is set at a temperature causing to break a Si—H bond. Therefore, it is possible to set the temperature inside the chamber 1 to a predetermined temperature causing to break the Si—H bond within, a range of, for example, 540 to 580° C.

Before the above film forming process is performed, a seed layer may be formed on the surface of the wafer W. The seed layer can be efficiently formed within a shortened incubation time by forming a seed layer after an aminosilane gas, for example, diisopropylaminosilane (DIPAS) is caused to adsorb onto the surface of the silicon substrate.

Working Examples or the Like

Next, various working examples using the film deposition apparatus of the embodiment and experimental results of the working examples are described. Hereinafter, the experimental results described below are not always limited to those of working examples of the method of depositing the film of the embodiment, and may include contents of reasons for setting various setup values in the method of depositing the film and the film deposition apparatus of the embodiment.

Figure 7:
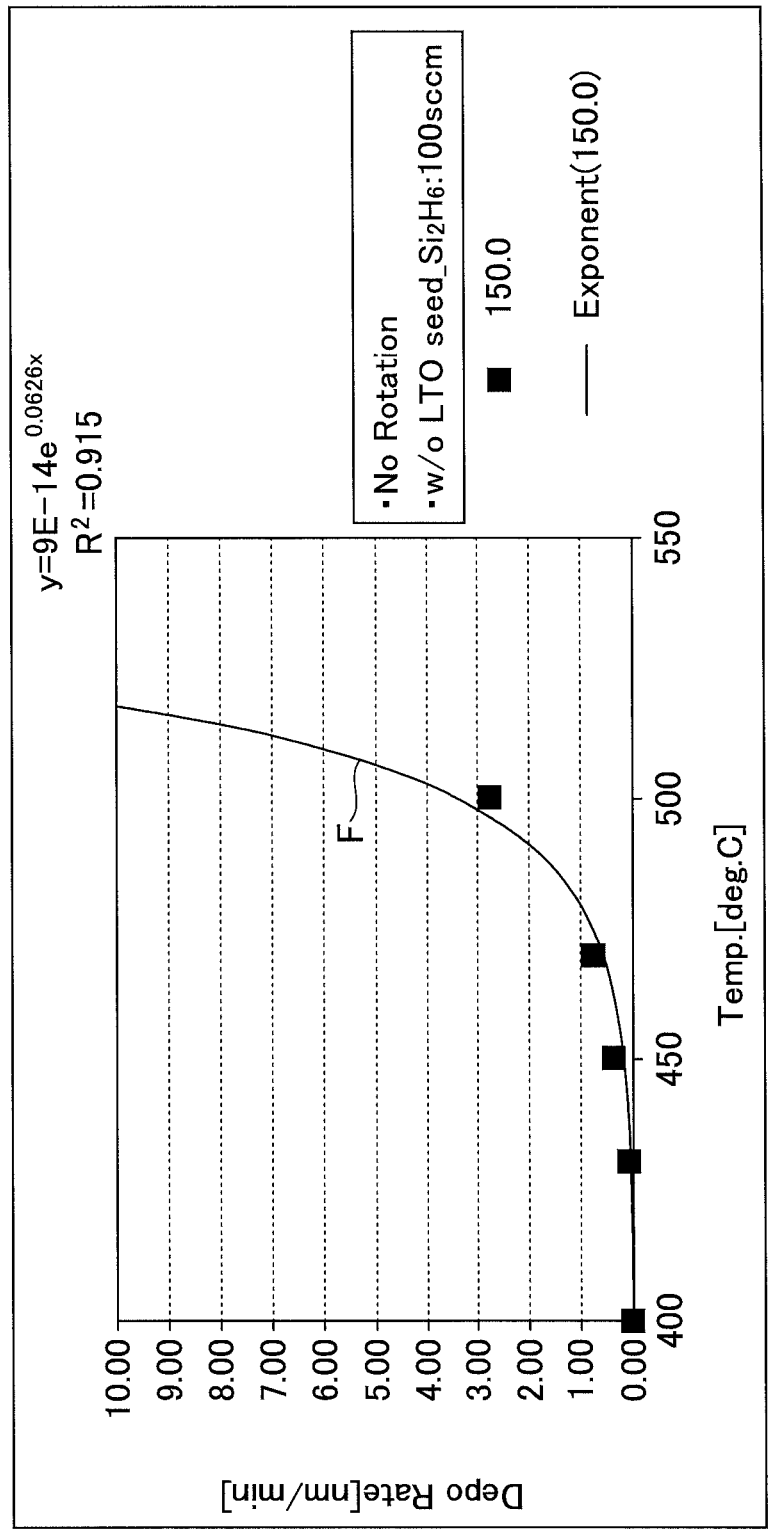
FIG. 7 illustrates an experimental result of temperature-dependent properties in forming a silicon film in a case where a turntable is not rotated.

FIG. 7 illustrates an experimental result of temperature-dependent properties in forming a silicon film in a case where the turntable is not rotated in the film deposition apparatus of the embodiment. Referring to FIG. 7, the abscissa axis represents a temperature [° C.], and the ordinate axis represents a film deposition rate [nm/min]. The experiment is performed to confirm at which temperature the silicon film is formed on the wafer W, on which the seed layer is not formed, when the temperature of the heater unit 7 is increased without rotating the turntable 2. The process conditions are 1.8 Torr inside the chamber 1 and the $Si_2H_6$ gas flow rate is 100 sccm. Under these conditions, the temperature is changed variously and the experiments are performed. In the experiment, it is not specifically checked whether the film is formed by ALD or CVD. It is only checked that silicon is simply formed. The formation of the silicon film is checked at a center point of the wafer W, which is 150.0 mm from the upper end of the ordinate axis (Y axis) passing through the center of the wafer W having a diameter of 300 mm.

Referring to a characteristic curve F of FIG. 7, the film deposition rate is substantially 2.0 zero between 400° C. to 430° C., where no film deposition can be observed, and the film deposition rate becomes equal to and greater than zero in the temperature equal to or greater than 430° C. When the turntable 2 is not rotated, the film is formed at the temperature equal to or greater than 430° C. The experiment illustrated in FIG. 7 shows that it is necessary to make the temperature inside the chamber 1 equal to or greater than 430° C. in order to form the silicon film.

Figure 8A:
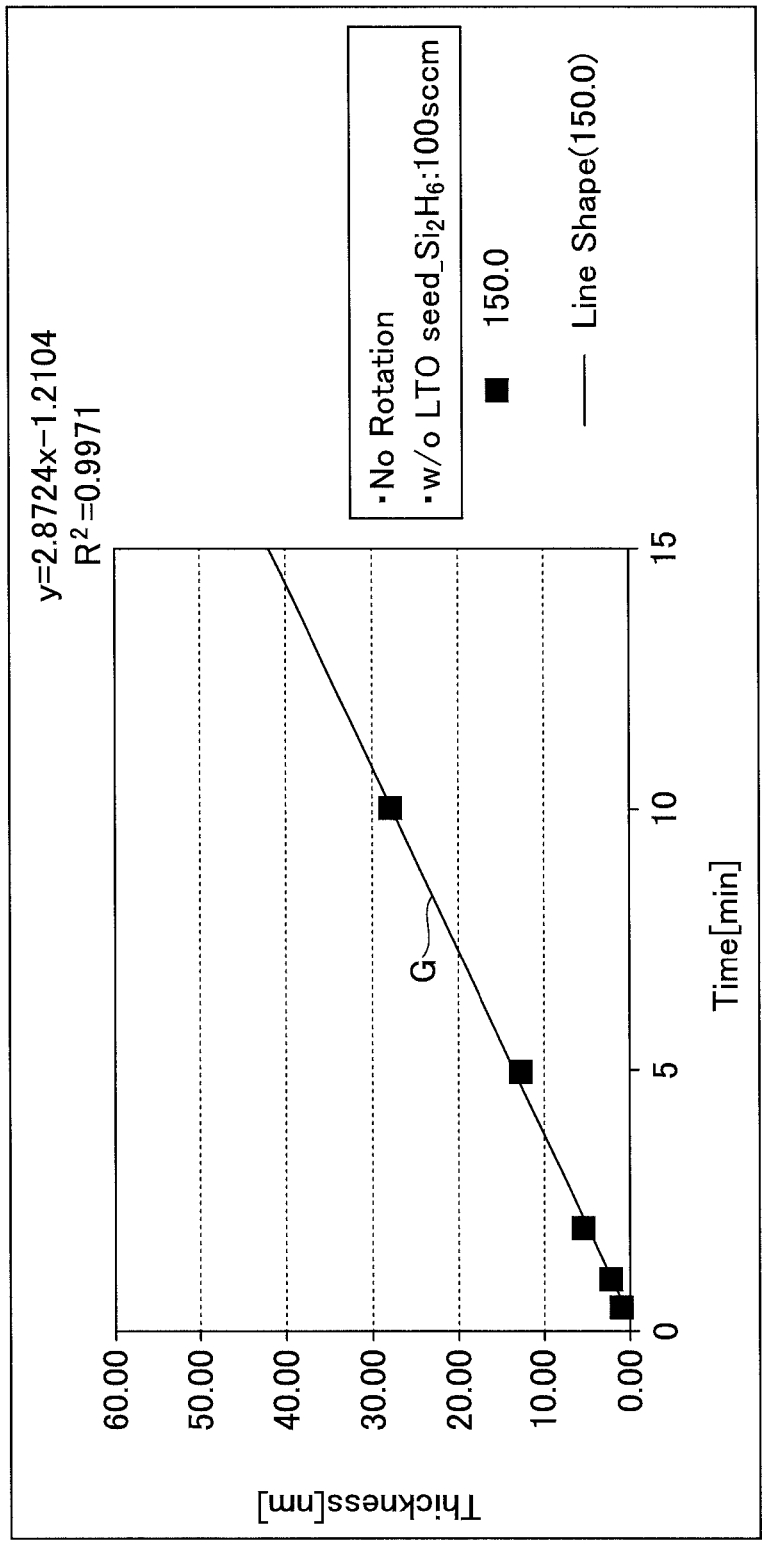
FIG. 8A illustrates an experimental result of time-dependent properties in forming a film in a case where the film deposition apparatus of the embodiment is used, where the full scale of the abscissa axis is 15 minutes.
Figure 8B:
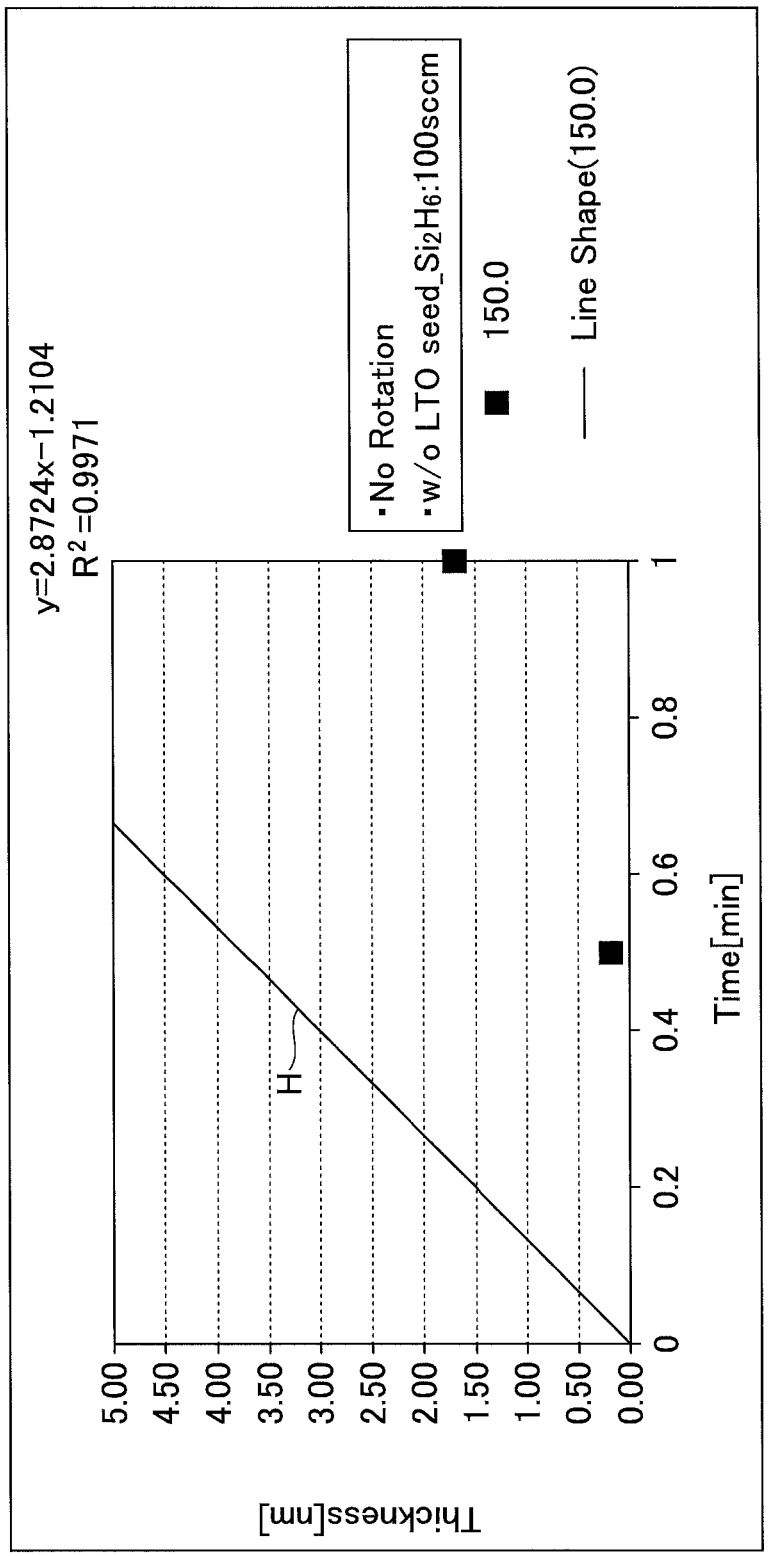
FIG. 8B illustrates an experimental result of time-dependent properties in forming the film in the case where the film deposition apparatus of the embodiment is used, where the full scale of the abscissa axis is 1 minute to focus on an initial stage of the film formation.

FIG. 8A illustrates an experimental result of time-dependent properties in forming the film in a case where the film deposition apparatus of the embodiment is used. FIG. 8A illustrates the time-dependent properties where the full scale of the abscissa axis is 15 minutes. FIG. 8B illustrates the time-dependent properties where the full scale of the abscissa axis is 1 minute. The measured position is the center point of the wafer W in a manner similar to FIG. 7. Further, in this experiment, the turntable 2 is not rotated.

Referring to FIG. 8A, the time and the film thickness are proportional along a characteristic line G indicative of the measurement result. The characteristic line G indicates a film forming characteristic having a line shape as a whole.

On the other hand, if the time-dependent properties in the film formation within one minute are enlarged, as illustrated by plotted points, the film formation is not actually started from zero but from about 0.5 min (i.e., 30 sec). A characteristic line H is an imaginary line for comparing with the characteristic line G and is drawn on the assumption that the characteristic line G is in a complete line shape within a range of one minute. In comparison with the line shape characteristic line G, in which the film formation proportionally starts from the time zero, the film formation actually starts after about 0.5 min in comparison with the characteristic lines G and H. Hereinafter, this time of delay is referred to as an incubation time. As illustrated in FIG. 8B, the incubation time exists in the vicinity of 0.5 min (30 sec), and so, the film formation has a time delay. Within the method of depositing the film of the embodiment, the incubation time is successfully made zero. Hereinafter, explanation about this is given.

FIG. 9 illustrates an experimental result for comparing temperature-dependent properties between the CVD reaction and the ALD reaction in a case where the method of depositing the film of the embodiment is performed. Referring to FIG. 9, the abscissa axis represents a temperature [° C.], and the ordinate axis represents a film deposition rate (the amount of film formed per a unit time) [nm/min]. In a manner similar to the experiments illustrated in FIGS. 7 and 8, the film deposition rate is measured at the center point of the wafer W.

The characteristic line I represents a time characteristic of the film deposition rate in a case where the film is formed without rotating the turntable 2. The gas flow rate of the $Si_2H_6$ gas is 100 sccm. In the characteristic line I, the film formation starts around 430° C., and the film deposition rate increases as the temperature increases until 500° C. Although the film deposition rate is fast in the characteristic line I, the film deposition rate increases at a temperature sufficiently lower than the temperature equal to or greater than 550° C. where the S—H bond is broken. Therefore, it is known that the CVD reaction is produced instead of the ALD reaction. Therefore, in the reaction indicated by the characteristic line I, not only the silicon film but also $SiH_3$ is formed by depositing with the CVD reaction.

On the other hand, in a characteristic line J, the film is formed under process conditions of a pressure inside the chamber 1 of 0.25 Torr, a rotational speed of the turntable 2 of 20 rpm, and a gas flow rate of the $Si_2H_6$ gas of 300 sccm. In the characteristic line J, it is known that the film deposition rate is not as fast as the characteristic line I and the film is formed in a line shape in a range of equal to or greater than 550° C. and less than 600° C. (approximately, equal to or less than 590° C.).

As described, if the turntable 2 does not rotate, the CVD reaction starts at the temperature equal to less than 500° C. It is known that the ALD reaction can be produced if the turntable 2 is rotated at around 20 rpm and the temperature is set to be equal to or greater than 550° C. and less than 600° C. These results match the method of depositing the film described above.

Figure 10:
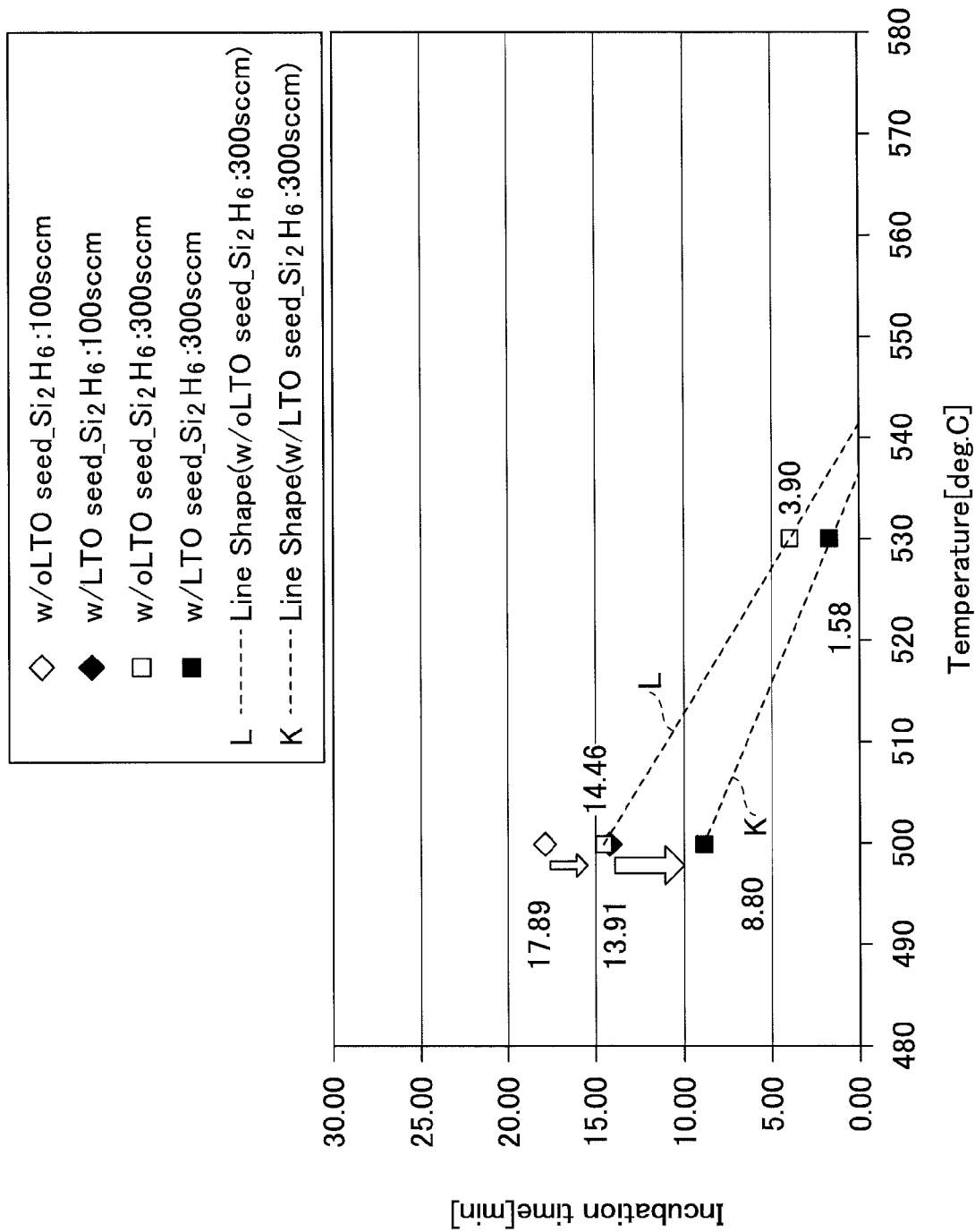
FIG. 10 illustrates a relationship between a temperature and an incubation time in a $SiH_3$ molecular layer depositing process of the method of depositing a film of a working example 1 of the present invention.

FIG. 10 illustrates a relationship between a temperature and an incubation time in a $SiH_3$ molecular layer depositing process of the method of depositing the film of the working example 1 of the present invention. Referring to FIG. 10, the abscissa axis represents a temperature [° C.], and the ordinate axis represents a incubation time [min]. FIG. 10 illustrates the incubation time in the $SiH_3$ molecular layer depositing process. Therefore, if the bare silicon atomic layer is exposed on the surface and formed, the incubation time is zero. If an ideal state is not ideal, the incubation time increases.

Referring to FIG. 10, black rectangles designate data when the seed layer is formed on the wafer W and the $Si_2H_6$ gas flow rate is 300 sccm, and white rectangles designate data when a seed layer is not formed on the wafer W and the $Si_2H_6$ gas flow rate is 300 sccm. Referring to FIG. 10, black rhombus designates data when the seed layer is formed on the wafer W and the $Si_2H_6$ gas flow rate is 100 sccm, and a white rhombus designates data when a seed layer is not formed on the wafer W and the $Si_2H_6$ gas flaw rate is 100 sccm. The black rectangles are connected by a line K, and the white rectangles are connected by a line L.

Referring to FIG. 10, the incubation time is zero at around 535° C. in the line K where the seed layer exists and at around 540° C. in the line L where a seed layer does not exist. As described, since the atomic layer is exposed on the surface by the incubation time, the incubation time corresponds to the temperature at which a Si—H bond is broken by heat. Because the Si—H bond can be broken at around 540° C., it is preferable to set the temperature inside the chamber 1 equal to or greater than 540° C.

In comparison with the line K indicative of the characteristics of the wafer W where the seed layer is formed and the line L indicative of the characteristics of the wafer W where the seed layer is not formed, the incubation time in the line K is much less than the incubation time in the line L at around 500° C. Therefore, the incubation time can be shortened in the wafer on which the seed layer is formed. However, as described above, the incubation time is zero at around 540° C. in the line L without the seed layer. Therefore, if the temperature of the heater unit 7 is set to equal to or greater than about 540° C., the incubation time can be zero even if the seed layer does not exist. Therefore, within the method of depositing the film in the working example 1, even though the seed layer is not formed on the wafer W, the silicon film can be quickly formed after the film formation is started by setting the temperature of the heater unit 7 to be equal to or greater than about 540° C.

The incubation time is shortened in line K in comparison with the line L as a whole. In comparison with the black rhombus indicative of the data of wafer W on which the seed layer exists and the white rhombus indicative of the data of wafer W on which the seed layer does not exist, the incubation time is shorter in the black rhombus. As a tendency as a whole, since the incubation time can be shortened by forming the seed layer, the seed layer is formed on the wafer W and the method of depositing the film of the working example 1 may be performed.

As to the existence of the seed layer, when the black rectangles and the black rhombus having different $Si_2H_6$ gas flow rates are compared with the white rectangles and the white rhombus having different $Si_2H_6$ gas flow rates, the incubation time is longer as the $Si_2H_6$ gas flow rate is smaller. Thus, a gas concentration influences the incubation time. Within the range where the CVD reaction is not produced, it is observed the incubation time is effectively shortened as the concentration and the flow rate of the $Si_2H_6$ gas are increased.

From these results, the temperature inside the chamber 1 is set equal to 540° C. or greater, for example 540° C. to 580° C., preferably 550° C. to 570° C., in the method of depositing the film and the film deposition apparatus of the working example 1. This temperature matches 550° described in the above "Research-Atomic Layer Deposition".

In the working example 1, it is known that the method of depositing the silicon film and the hydrogen desorption step of the embodiment may be performed after the seed layer is formed.

FIG. 11 illustrates a result of performing a method of depositing the film of a working example 2 and a result of running a film deposition apparatus of the working example 2. Within the working example 2, the temperature of the heater unit 7 is 570° C., the temperature inside the chamber 1 is 0.25 torr, and the rotational speed is 20 rpm. The pressure is set to be lower than 1.8 Torr in the above experiments and the working example 1. Further, a diisopropylaminosilane gas is supplied at a time flow rate of 900 sccm/5 min to thereby form the seed layer on the wafer W, the flow rate of the $Si_2H_6$ is 100 sccm, the $Si_2H_6$ is diluted by the $N_2$ gas, and the $N_2$ gas is supplied as a carrier gas. Then, the film thicknesses at positions of the via holes formed on the silicon wafer W are measured while the mix ratio (a flow rate ratio) between the $Si_2H_6$ gas and the carrier $N_2$ gas are variously changed. Then, step coverage is calculated. As to the formed via holes, the opening diameter is 65 nm to 70 nm, the depth is 1600 nm to 1800 nm, and the aspect ratio is 24 to 28.

Referring to FIG. 11, the ratio of $Si_2H_6$ gas/$H_2$ gas is 300/600, 100/800, 50/850, and 25/875. Referring to FIG. 11, the flow rate ratio of the $Si_2H_6$ gas relative to the $H_2$ gas is reduced more toward the right side. Further, the via hole on the left end side illustrates a state of the via hole before forming the film.

The film thicknesses are measured at the upper end, at the of 50 nm from the upper end, at the depth 250 nm from the upper end (in a range of TOP in FIG. 11), at the depth 800 nm from the upper end (in a range of MID in FIG. 11), and at the depth 1600 nm to 1800 nm from the upper end (in a range of BTM in FIG. 11).

In comparison with the data, as the flow rate ratio of the $Si_2H_6$ gas is lower, the difference among the above positions is small to thereby improve the step coverage. Said differently, in the data on the right end side surrounded by a bold line, a uniform film thickness characteristic of 22 nm is observed in all positions, except for the film thickness in the upper end (TOP) is 24 nm. Therefore, the measurement result shows extremely good evenness where the step coverage is 92 in all positions.

As described, according to the method of depositing the film and the film deposition apparatus of the working example 2, the film formation having good coverage is obtainable by setting the pressure inside the chamber 1 low and setting the flow rate ratio of the $Si_2H_6$ gas lower than that of the carrier N2 gas.

The reason why the coverage is better as the flow rate ratio of the $Si_2H_6$ gas is smaller is assumed as follows. In the method of depositing the film and the film deposition apparatus of the working example 2, a $Si_2H_6$ gas having a low temperature is supplied into the first process area P1 and the turntable 2 is rotated to thereby instantaneously form a state in which the temperature is lower than about 100° C. than an atmosphere surrounding the vicinity of the surface of the wafer W. However, because the atmosphere surrounding the vicinity of the surface of the wafer W is still high, it is considered that the CVD reaction is constantly apt to be produced. Further, the state where the ALD reaction or the MLD reaction is produced is instantaneously occur in the vicinity of the surface of the wafer W, the $Si_2H_6$ gas is considered to be instantaneously changed to a gas causing to produce the CVD reaction with the temperature of the atmosphere surrounding the vicinity of the surface of the wafer W. Therefore, the amount of the $Si_2H_6$ gas is sufficient to be the minimum gas necessary to be directly supplied onto the surface of the wafer W. In order to satisfy the condition, it is assumed to be preferable to restrict the flow rate ratio of the $Si_2H_6$ gas so as not to be excessively great and make the pressure low.

As described, according to the method of depositing the film and the film deposition apparatus of the embodiment and the working example 2, it is possible to form an even silicon film having good coverage with a high productivity.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing a film have been described in detail, it should be understood that the various changes, substitutions, and alterations could be made hereto without departing from the spirit and scope of the invention.

What is claimed is:

1. A method of depositing a film for forming a silicon film on a substrate, which is mounted on a turntable and can pass by rotation through a first process area and a second process area, which are separately arranged along a peripheral direction in a chamber substantially in a cylindrical shape set to have a first temperature capable of cutting a Si—H bond, the method comprising:
    a molecular layer deposition step of supplying a $Si_2H_6$ gas set to have a second temperature less than the first temperature when the substrate passes through the first process area thereby forming a $SiH_3$ molecular layer on a surface of the substrate; and
    a hydrogen desorption step of causing the substrate, on the surface of which the $SiH_3$ molecular layer is formed, to pass through the second process area maintained to have the first temperature thereby cutting the Si—H bond and leaving only a silicon atomic layer on the surface of the substrate.

2. The method according to claim 1,
wherein the second temperature is an ambient temperature.

3. The method according to claim 2,
wherein the first temperature is in a range of 540° C. to 580° C.

4. The method according to claim 3,
wherein the molecular layer deposition step is performed while the silicon film is exposed on the substrate, includes a molecular layer deposition reaction, which is to be produced under an atmosphere in a range of 430° C. to 470° C. when the turntable is fixed, and instantaneously forms an atmosphere in a range of 430° C. to 470° C. in the vicinity of the surface of the substrate by supplying the $Si_2H_6$ gas having the second temperature and by the rotation of the turntable.

5. The method according to claim 1,
wherein a cycle of the molecular deposition step and the hydrogen desorption step is continuously repeated a plurality of times.

6. The method according to claim 1,
wherein, in a space where the substrate moves from the first process area to the second process area, a first separating area is provided to separate the first process area from the second process area, the method further comprising:
a CVD reaction restriction step for causing the substrate to pass through the first separating area and supplying a purge gas onto the surface of the substrate thereby restricting a CVD reaction of $SiH_3$ from producing after the molecular layer deposition step.

7. The method according to claim 1,
wherein, in a space where the substrate moves from the second process area to the first process area, a second separating area is provided to separate the second process area from the first process area, the method further comprising:
a separation step for causing the substrate to pass through the second separating area and supplying a purge gas onto the surface of the substrate after the hydrogen desorption step.

8. The method according to claim 1,
wherein the second process area has an area wider than the first process area, and
the hydrogen desorption step is performed longer than the molecular layer deposition step.

9. The method according to claim 1,
wherein the substrate is a silicon substrate.

10. The method according to claim 9, further comprising:
a seed layer formation step of forming a seed layer on the surface of the silicon substrate before the molecular layer deposition step is started.

11. The method according to claim 10,
wherein the seed layer formation step includes a process of supplying an organic aminosilane gas onto the surface of the silicon substrate.

12. The method according to claim 1,
wherein the substrate includes a plurality of substrates,
the plurality of substrates are mounted on the turntable along the peripheral direction,
the silicon film is simultaneously formed on the plurality of substrates by the rotation of the turntable.

13. The method according to claim 1,
wherein the $Si_2H_6$ gas is supplied while the $Si_2H_6$ gas is diluted by a purge gas.

14. A film deposition apparatus comprising:
a chamber that is substantially in a cylindrical shape and is set to have a first temperature capable of cutting a Si—H bond;
a turntable, which is provided inside the chamber and is rotatable and on which a substrate is mounted;
a first process area, which is provided in the chamber in a peripheral direction, and inside which a $Si_2H_6$ gas having a second temperature less than the first temperature is supplied, a $SiH_3$ molecular layer is formed on the substrate by a molecular layer deposition method when the substrate passes through the first process area along with a rotation of the turntable; and
a second process area, which is provided apart from the first process area in the peripheral direction, and inside which the Si—H bond of the $SiH_3$ molecular layer formed on the substrate is broken when the substrate passes through the second process area along with the rotation of the turntable to resultantly leave only a silicon atomic layer on the substrate.

15. The film deposition apparatus according to claim 14,
wherein the second temperature is an ambient temperature.

16. The film deposition apparatus according to claim 15,
wherein the first temperature is in a range of 540° C. to 580° C.

17. The film deposition apparatus according to claim 16,
wherein when the $SiH_3$ molecular layer is formed in the first process area, the silicon film is exposed on the substrate, a molecular layer deposition reaction, which is to be produced under an atmosphere in a range of 430° C. to 470° C. when the turntable is fixed, is produced, and an atmosphere in a range of 430° C. to 470° C. is instantaneously formed in the vicinity of the surface of the substrate by supplying the $Si_2H_6$ gas having the second temperature and by the rotation of the turntable.

18. The film deposition apparatus according to claim 14,
wherein the turntable is rotated a plurality of times, and processes performed in the first and second process areas are continuously repeated a plurality of cycles.

19. The film deposition apparatus according to claim 14, further comprising:
a first separating area, which is provided in a space where the substrate moves from the first process area to the second process area, and is configured to separate the first process area from the second process area,
wherein, in the first process area, a purge gas is supplied onto the surface of the substrate thereby restricting a CVD reaction of $SiH_3$ from producing.

20. The film deposition apparatus according to claim 14, further comprising:
a second separating area provided in a space where the substrate moves from the second process area to the first process area, and is configured to separate the second process area from the first process area,
wherein, in the second separating area, a purge gas is supplied onto the surface of the substrate.

* * * * *